United States Patent
Fairbanks

(10) Patent No.: US 6,400,230 B2
(45) Date of Patent: Jun. 4, 2002

(54) METHOD AND APPARATUS FOR GENERATING AND DISTRIBUTING A CLOCK SIGNAL

(75) Inventor: Scott M. Fairbanks, Mountain View, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/767,336

(22) Filed: Jan. 22, 2001

Related U.S. Application Data

(63) Continuation-in-part of application No. 09/422,885, filed on Oct. 21, 1999, now Pat. No. 6,191,658.

(51) Int. Cl.[7] .......................... H03B 5/24; H03B 27/00; G06F 1/04; H03K 3/00
(52) U.S. Cl. .............................. 331/57; 331/45; 331/46; 331/175; 331/60; 327/291
(58) Field of Search .............................. 331/45, 47, 46, 331/50, 57, 60, 111, 143, 177 R, 175; 327/291–299

(56) References Cited

U.S. PATENT DOCUMENTS 6,137,369 A * 10/2000 Kermani ...................... 331/45
6,191,658 B1 * 2/2001 Fairbanks ..................... 331/57

* cited by examiner

*Primary Examiner*—David Mis
(74) *Attorney, Agent, or Firm*—Park, Vaughan & Flemming LLP

(57) ABSTRACT

One embodiment of the present invention provides a system that generates a clock signal within an integrated circuit. This system includes four clocking elements organized into a ring, wherein each clocking element includes at least one input and at least one output, and wherein a signal at an input is complemented at a corresponding output. These clocking elements are spatially distributed throughout the integrated circuit, so that each clocking element provides the clock signal to a different region of the integrated circuit. These clocking elements are also coupled together though a plurality of interconnections, so that each output of each clocking element is coupled to at least one input of a neighboring clocking element. Furthermore, a given signal is inverted an odd number of times in traversing a closed path beginning and ending at any output of any of the four clocking elements and passing through a neighboring clocking element. In one embodiment of the present invention, each of the four clocking elements contains, a first node and a second node that are coupled together by a keeper circuit. Each clocking element also includes a first pair of inverters, each of which has an output coupled to the first node, and a second pair of inverters, each of which has an output coupled to the second node.

28 Claims, 6 Drawing Sheets

METHOD AND APPARATUS FOR GENERATING AND DISTRIBUTING A CLOCK SIGNAL

RELATED APPLICATION

This application is a continuation-in-part of a U.S. patent application, entitled "A High Speed Coupled Oscillator Topology," by inventor Scott M. Fairbanks, having Ser. No. 09/422,885 and a filing date of Oct. 21, 1999, now U.S. Pat. No. 6,191,658. This application hereby claims priority under 35 U.S.C. § 120 to the above-listed patent application. Moreover, the above-listed application is hereby incorporated by reference.

BACKGROUND

1. Field of the Invention

The present invention relates circuitry for generating clock signals for a digital system. More specifically, the present invention relates to a method and an apparatus for generating and distributing a clock signal between components within an integrated circuit with substantially minimal clock skew.

2. Related Art

Synchronous systems, such as computers, rely upon a clock signal to maintain control of data transfers between system components. Typically, the clock signal is generated at a single source and is distributed through chains of inverters of equal length to the individual latches. It is important that the clock signal arrives at each data latch at nearly the same time, so that operations that take place in one part of a circuit are properly synchronized with operations in other parts of the circuit.

However, it is impossible to match exactly the delay of all paths from the source of the clock signal to the individual latches. Cross-die processing variations and imprecision in the alignment of the fabrication equipment make this impossible. To complicate matters, die sizes are becoming larger, resulting in greater die variations and longer inverter chains, which result in greater path disparities.

As clock speeds increase, these disparities consume an increasingly larger fraction of the clock period. The disparity in the arrival time of a clock signal to a latch is called "skew". Note that skew causes uncertainty as to the time at which data is latched. Furthermore, note that calculations cannot be performed during periods when it is not certain that the data is valid. As clock speeds increase, the latch skew remains approximately constant. Hence, a smaller fraction of the clock period can be used for calculations. Note that as processor clock speeds increase, clock skews are beginning to approach the size of clock periods.

Clock skew can be compensated for by adding a timing margin to the clock cycle time. However, this added timing margin can become a significant fraction of the clock period, and can hence limit system performance.

One way so deal with this problem is to divide an integrated circuit into multiple clock domains that operate somewhat independently from each other. However, dividing an integrated circuit into multiple clock domains creates problems in synchronizing communications between the different clock domains.

What is needed is a method and an apparatus for generating and distributing a clock signal between components within a semiconductor chip so that circuit elements at different locations on the semiconductor chip remain properly synchronized at high clock speeds.

SUMMARY

One embodiment of the present invention provides a system that generates a clock signal within an integrated circuit. This system includes four clocking elements, wherein each clocking element includes at least one input and at least one output, and wherein a signal at an input is complemented at a corresponding output. These clocking elements are spatially distributed throughout the integrated circuit, so that each clocking element provides the clock signal to a different region of the integrated circuit. These clocking elements are also coupled together though a plurality of interconnections, so that each output of each clocking element is coupled to at least one input of a neighboring clocking element. Furthermore, a given signal is inverted an odd number of times in traversing a closed path beginning and ending at any output of any of the four clocking elements and passing through a neighboring clocking element.

In one embodiment of the present invention, each of the four of clocking elements includes an even number of inverters and a keeper circuit.

In one embodiment of the present invention, each of the four clocking elements contains, a first node and a second node that are coupled together by a keeper circuit. Each clocking element also includes a first pair of inverters, each of which has an output coupled to the first node, and a second pair of inverters, each of which has an output coupled to the second node.

In one embodiment of the present invention, the keeper circuit includes a pair of cross-tied inverters coupled to the first node and the second node.

In one embodiment of the present invention, the first node and the second node of each of the four clocking elements comprise eight nodes that oscillate at the same frequency and are grouped into four synchronized pairs that are offset from each other in phase by 90 degrees, whereby the eight nodes provide a multi-phase clock signal.

In one embodiment of the present invention, the system also includes a controllable voltage source coupled to the four clocking elements, whereby varying a voltage provided by the controllable voltage source varies an oscillation frequency of the four clocking elements.

In one embodiment of the present invention, the system also includes a plurality of clock distribution networks within the integrated circuit, wherein each clock distribution network distributes the clock signal from a clocking element to circuit elements within an associated region of the integrated circuit.

In one embodiment of the present invention, an output of each clocking element is coupled to at least one input of each of two neighboring clocking elements. In a variation in this embodiment, the four clocking elements comprise a given ring within a higher level ring of rings, wherein at least one input of a first clocking element in the given ring is coupled to an output of a second clocking element in a first neighboring ring, and wherein at least one output of a third clocking element in the given ring is coupled to an input of a fourth clocking element in a second neighboring ring.

Note that a clock signal in a conventional clock distribution system is generated from a single source. Whereas, the present invention generates a clock signal through the interaction of a large number of clocking elements distributed across the semiconductor die. Furthermore, note that a conventional clock distribution scheme is an open loop system. Hence, once the clock signal is generated it is propagated to the latches without compensation for die variations or transistor variations along the chain of inverters to the individual latches. In contrast, the present invention provides a closed loop system that adjusts to the actual conditions on the semiconductor die.

Furthermore, the maximum phase error in the present invention scales in proportion to the deviation from the average of the fastest and slowest transistors on the chip, whereas in a traditional clock tree, the error scales with the difference of speed between the fastest and slowest transistors.

Moreover, unexpected transistor strengths and loads cause extra or reduced voltage swings, but have little effect on phase. Hence, these unexpected delays have a second order effect in the present invention, whereas in a traditional clock tree, these unexpected delays have a first order effect on delay.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Clocking Element

Figure 1A:
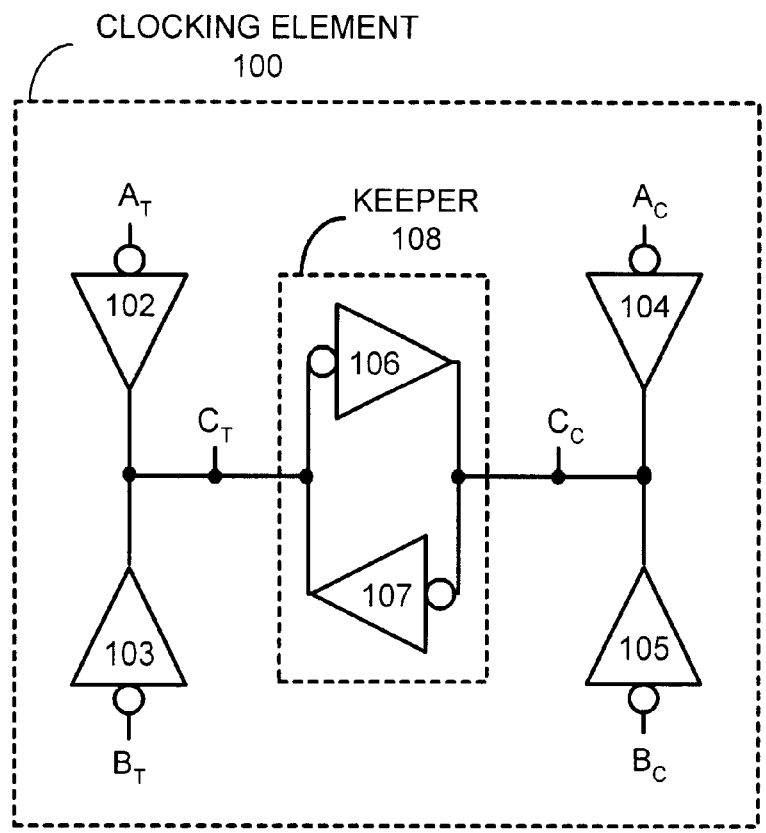
FIG. 1A illustrates a clocking element in accordance with an embodiment of the present invention.

FIG. 1A illustrates a clocking element 100 in accordance with an embodiment of the present invention. Clocking element 100 includes two output terminals $C_t$ and $C_c$. (Note that $C_c$ is the complement of $C_t$.) These output terminals are coupled to opposing ends of keeper circuit 108, which includes two cross-coupled inverters 106 and 107. One set of inputs to clocking element 100, $A_t$ and $A_c$, pass through inverters 102 and 104 before being coupled to terminals $C_c$ and $C_t$, respectively. (Note that $A_c$ is the complement of $A_t$.) Another set of inputs, $B_t$ and $B_c$, pass through inverters 103 and 105 before being coupled to terminals $C_c$ and $C_t$, respectively. (Note that $B_c$ is the complement of $B_t$.)

Figure 1B:
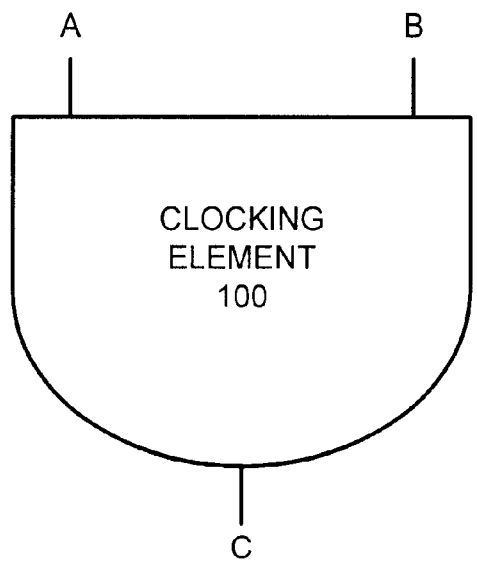
FIG. 1B illustrates another representation of a clocking element in accordance with an embodiment of the present invention.

FIG. 1B illustrates a simplified symbolic representation of clocking element 100 in accordance with an embodiment of the present invention. Note that each of the inputs, A and B, and the output, C, represents two wires that carry signals that are always complementary.

Ring of Clocking Elements

Figure 2:
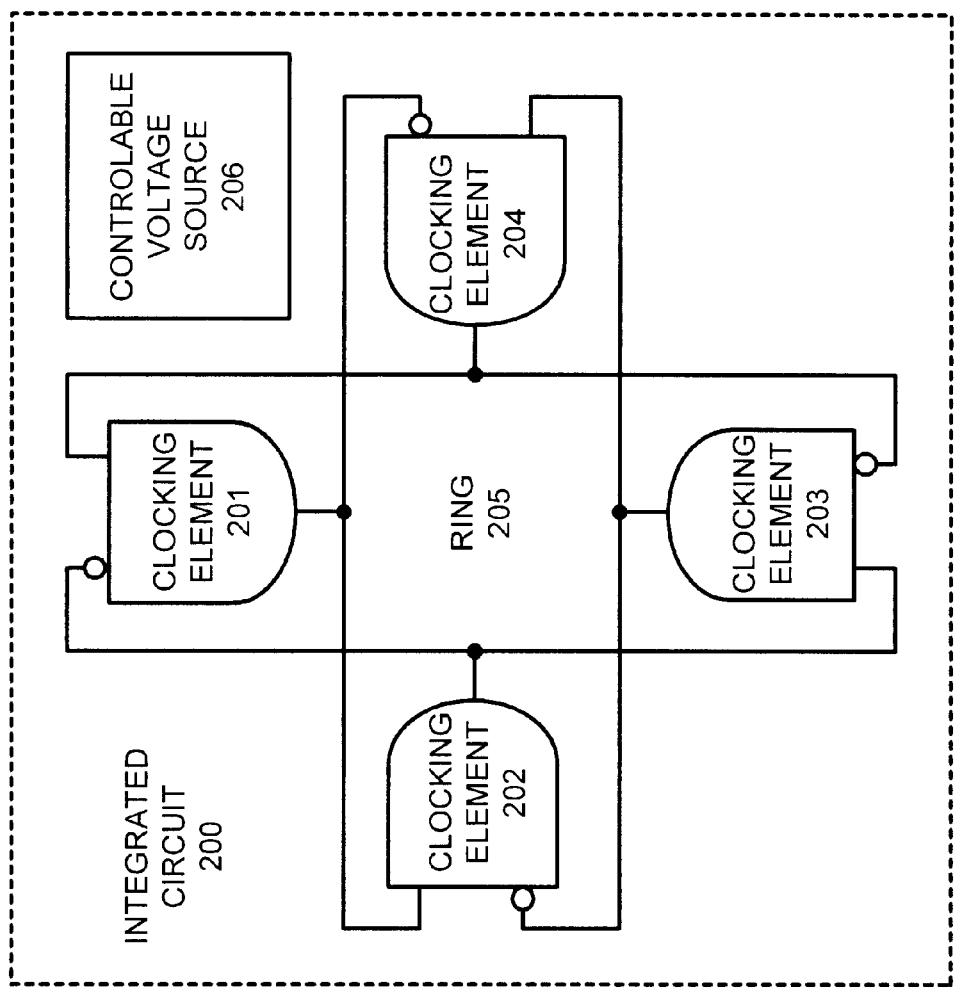
FIG. 2 illustrates how clocking elements are coupled together into a ring in accordance with an embodiment of the present invention.

FIG. 2 illustrates how clocking elements are coupled together into a ring 205 in accordance with an embodiment of the present invention. Ring 205 comprises clocking elements 201–204, which are coupled together through a number of signal lines to neighboring clocking elements as is illustrated in FIG. 2. The "bubbled" inputs specify that the complementary inputs are wired in reverse. In other words, output $C_T$ of clocking element 201 is connected to input $B_T$ of clocking element 202, and to input $A_C$ of clocking element 204. Moreover, output $C_C$ of clocking element 201 is connected to input $B_C$ of clocking element 202 and to input $A_T$ of clocking element 204.

Figure 3:
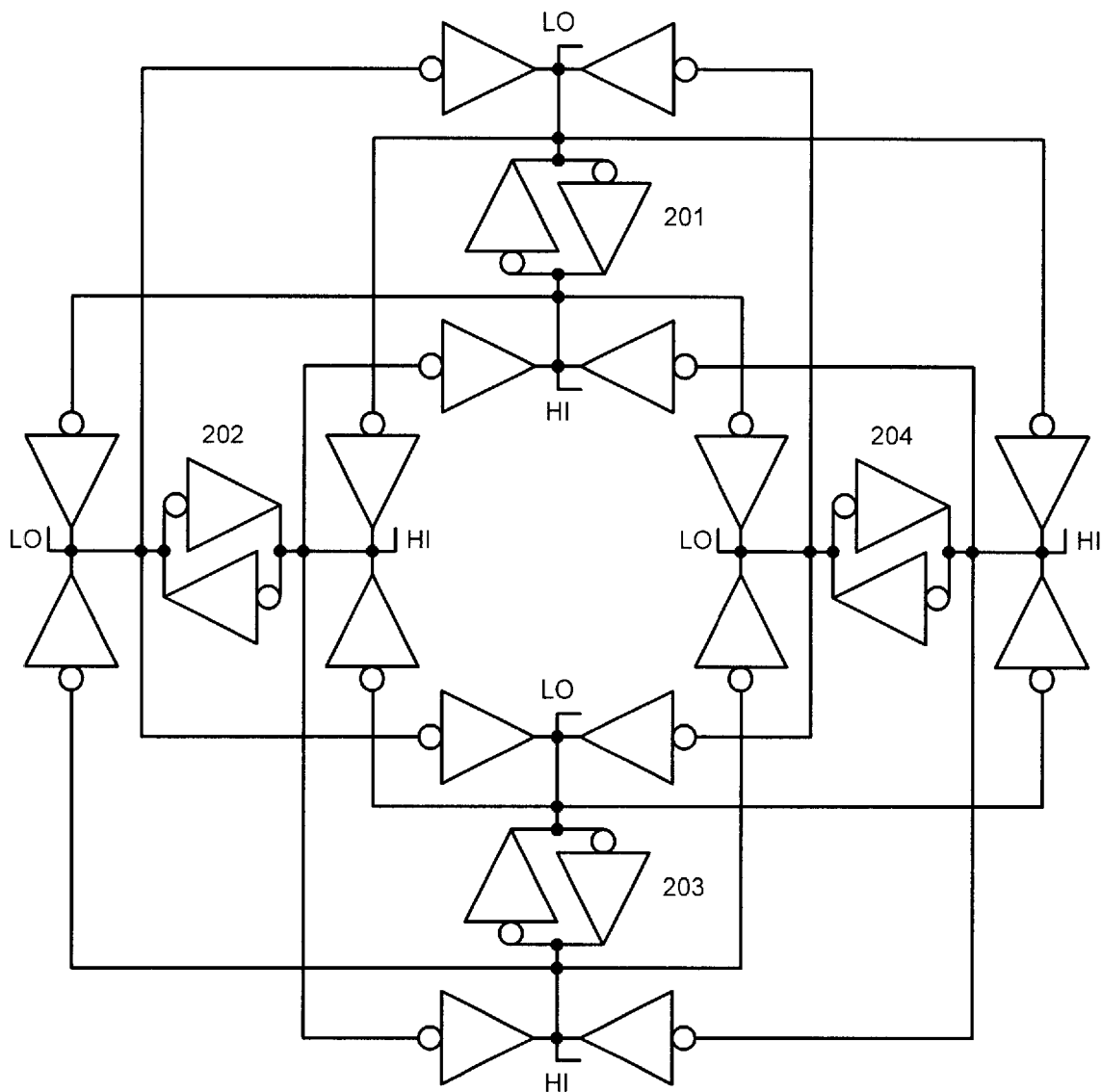
FIG. 3 provides a more-detailed illustration of the ring of clocking elements in accordance with an embodiment of the present invention.

FIG. 3 provides a more-detailed illustration of the ring of clocking elements 205 illustrated in FIG. 2 in accordance with an embodiment of the present invention. Note that the "HI" and "LO" labels specify initial conditions for the circuit.

Also note that the clocking circuit illustrated in FIG. 3 provides two copies of each of four signals that oscillate at the same frequency offset by 90 degrees. This circuit produces signals that oscillate around the $V_{DD}/2$, which is the highest gain fraction of the voltage space. A greater range of the signal is usable around this voltage point than any other.

The circuitry illustrated in FIG. 3 includes 24 inverters that are coupled together into an eight-node network, wherein there are two complementary nodes for each clocking element. Note that each wire or node in FIG. 3 produces a signal of the same frequency. Also note that each of these nodes is equally responsible for generating the oscillations. Hence, the responsibility for creating the signals is distributed between the nodes.

Each of the four clocking circuits 201–204 is initialized as is specified by the "HI" and "LO" signals in FIG. 3.

Note that each node in this clock distribution system is driven by three inverters. The contributions of these three drivers are summed at the node they drive. The logic value of the node is switched decisively if all three drivers agree that it should be. It is switched reluctantly if only two of the three drivers agree it should be. It does not switch at all if only one of the three drivers think it should.

The four separate clocking elements 201–204 illustrated in FIG. 2 are constructed, coupled and initialized so that each of the drivers that drive a node should all simultaneously agree when a node should switch. For the reasons mentioned above, there are short periods when the three drivers disagree as to what the state of the output node should be. This causes a slowdown of the transition at the node where the disagreement occurs. A slowdown at the node causes a slowdown in the two inverters that this one node drives. These two inverters in turn drive two other inverters. These inverters then slowdown the node they are each driving. Eventually, the slowdown affects each node in the system. After an initial start up transient, the clock distribution system reaches a steady state wherein each node oscillates at the same frequency and a steady phase offset in relation to the other nodes.

Note that the present invention tends to average out variations in die processing. The greatest phase offset between the clock arrival at two latches in a typical clock tree is typically between the latches built in the silicon whose properties are most favorable to fast transistors and the silicon whose properties are least favorable to fast transistors. The phase error in the clock tree is proportional to the degree of variation in the properties of the silicon that make a transistor fast or slow. Conversely, the clocking circuit of the present invention produces clock phase errors that are proportional to the deviation from the average of these speed properties. The same reasoning applies to variations in the actual loading of nodes found in a path through a clock tree to the individual latches.

Also note that in the present invention, unexpected effects are manifested in changed voltage swings, not phase errors. In a traditional clock tree, additional or reduced load or stronger or weaker than expected transistors result in more or less delay. Again, the deviation in delay is manifested in phase error. In contrast, the clocking system of the present invention manifests these same problems primarily in reduced voltage swing, not delay and phase error. This reduced voltage swing may cause the gate that is being driven to operate more slowly, which is equivalent to phase error; but this is a second order effect.

Note that all nodes in the clock distribution apparatus oscillate at the same frequency. Remember that a node will switch reluctantly if only two of the inverters driving the node agree that the value should change. That node will continue to change at the same frequency even if the third driver never agrees that the output should change. The lack of drive at that node is compensated for by a reduced voltage swing at that node, not reduced frequency. Unexpected loads and transistor strengths result in waveforms that oscillate at the same frequency and nearly the same phase, only at different strengths. Note that the reduced voltage swing of the oscillation is centered around half the supply voltage.

Also note that each node is driven by three inverters. Hence, any deviation in load on a node will result in a third of the phase error caused by the same deviation when driven by a single inverter.

Furthermore, note that typical latches require both a clock signal and a complement clock signal to operate. The complement clock signal is often generated by tapping off the clock signal and passing it through an odd number of inverters. However, it is difficult to match both the arrival time and the drive strength of the two signals using this method. Fortunately, each signal generated by the illustrated embodiment of the present invention is produced along with a complement signal.

Note that the clock signal generated by the present invention may be too fast for certain applications. Fortunately, there are many ways to divide down a clock signal. Also note that if the clock signal generated by the present invention is out of phase, and if the clock signal is divided down by a factor of four to produce a slower clock signal, that phase error will also be divided by a factor of four.

Note that integrated circuit 200 illustrated in FIG. 2 includes a controllable voltage source 206, which provides a variable voltage to clocking elements 201–204. In one embodiment of the present invention, the speed of the clock generation system can be changed to a specific frequency by using a single pole frequency lock loop control system and a controllable voltage source 206 to control the supply voltage to clocking elements 201–204.

Ring of Rings

Figure 4:
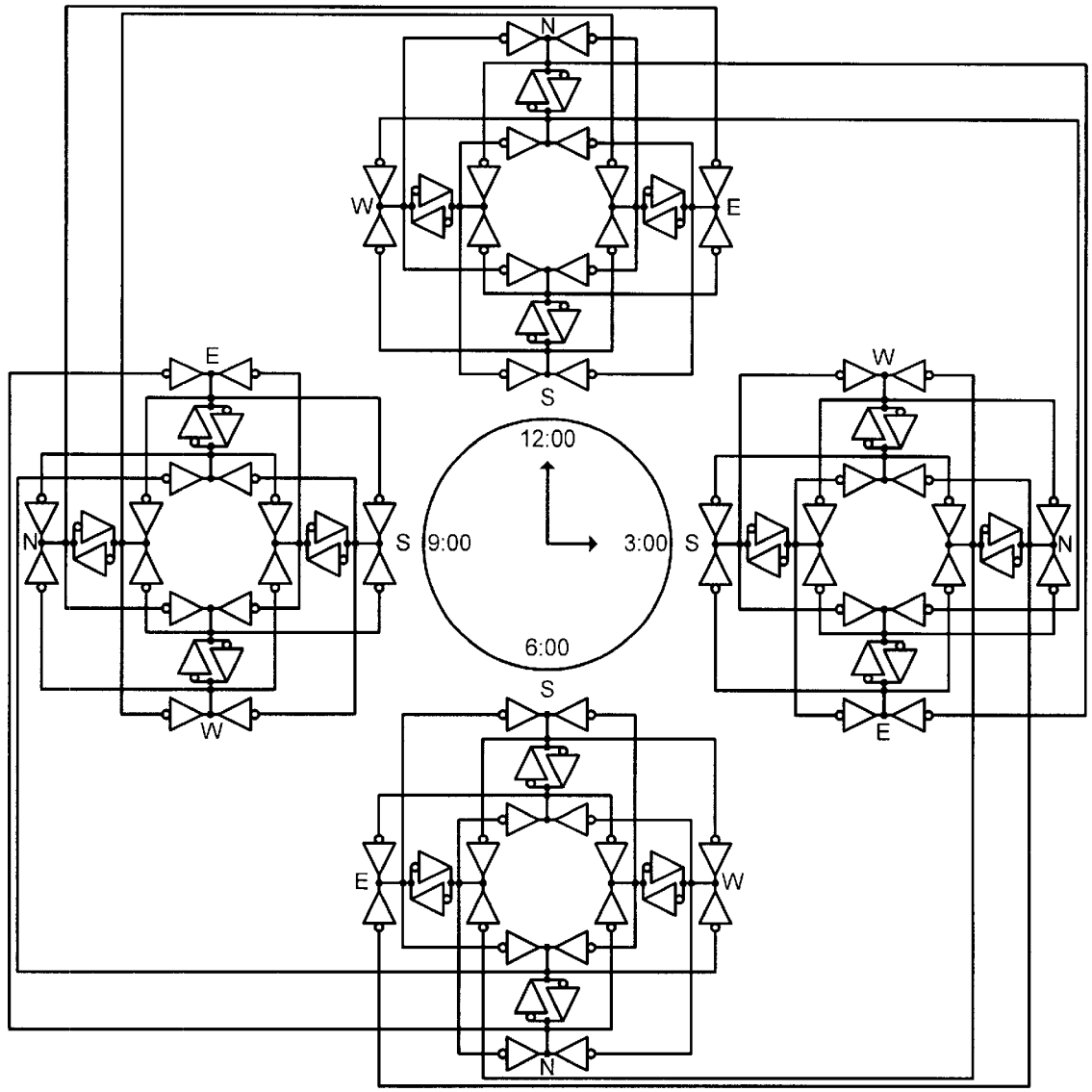
FIG. 4 illustrates how rings of clocking elements can be combined into a higher-level ring in accordance with an embodiment of the present invention.

FIG. 4 illustrates how rings of clocking elements can be combined into a higher-level ring in accordance with an embodiment of the present invention. The purpose of this higher-level ring is to provide a larger number of nodes distributed over a greater area from which to tap off clock signals to drive latches.

The circuitry illustrated in FIG. 4 includes four copies of the four-node rings illustrated in FIGS. 2 and 3. The four-node rings are arranged along the quarter hour points of a clock at three o'clock, six o'clock, nine o'clock, and 12 o'clock positions. Likewise, within the individual rings, the clusters of inverters that implement the clocking elements are aligned along the cardinal directions, north, south, east, and west (see FIG. 4).

Notice that next to each of the clocking circuits in the four copies of the four-node rings there is a label, "N", "S", "E" or "W". If these four copies are initialized the same and started at the same time, which can be done by simply powering them up at the same time, then the circuit element labeled N at each of the four copies operates at the exact same frequency and phase.

Note that the outputs are at the exact same frequency and phase because their inputs are at substantially the same frequency and phase. It makes no difference if the inputs are driven from nodes within the specific ring, or from the similar nodes in a neighboring ring.

Also, note that in practice the phases will not be exactly the same because there will be some amount of phase offset for the reasons listed in the background section.

Furthermore, note that there still remain eight signals oscillating at the same frequency which can be grouped into four pairs offset from each other by 90 degrees. However, now there are four copies of each of these signals driven from different nodes.

Moreover, note that each clocking element has A and B inputs and an output, and that each of these signals have a true and a complement version. The output of the northern clocking element in FIG. 4 drives the "A" inputs of the eastern clocking element. Instead of having the northern clocking element in the 12:00 ring driving the eastern clocking element in the same ring, the northern clocking element in the 12:00 ring drives the eastern clocking element in the 9:00 ring. Likewise, the northern clocking element of the 9:00 ring drives the eastern clocking element of the 6:00 ring, and so on. FIG. 4 illustrates this first alteration/coupling between the oscillators.

In order to couple the oscillators tighter, the same sharing of connections can be done with another input. Instead of having an output from the 12:00 ring driving an input to the 3:00 ring, and an output from the 3:00 ring driving an input to the 6:00 ring, and so on, the signals move counter-clockwise, with an output of the 12:00 ring driving a 9:00 input, and an output of the 9:00 ring driving a 6:00 input, and so on.

In another embodiment of the present invention, the ring outputs drive the inputs of the ring directly across the higher-level ring instead of in adjacent rings. Note that no two nodes are more than six inversions away from each other. However, this distance can be shortened with additional connections.

With the alterations discussed above there are eight copies of each of the four phases. More importantly, they are located at different physical locations so they can drive latches in different places at substantially the same frequency and phase.

Also note that the higher-level ring can itself be a building block in an even higher level ring, and so on, into larger and larger rings.

Clock Distribution Networks

Figure 5:
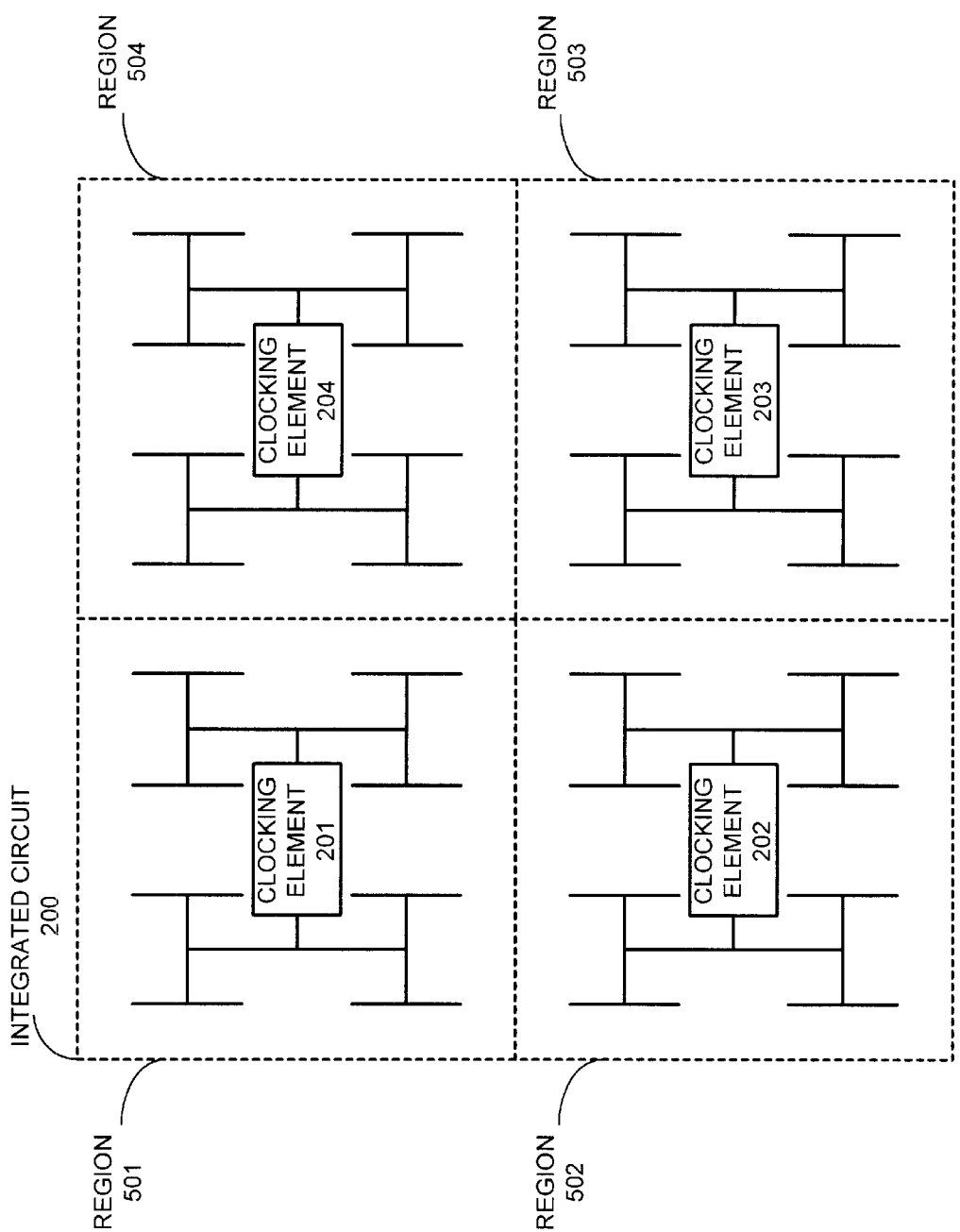
FIG. 5 illustrates how clocking elements are coupled to clock distribution networks in accordance with an embodiment of the present invention.

FIG. 5 illustrates how clocking elements 201–204 are coupled to clock distribution networks in accordance with an embodiment of the present invention. In FIG. 5, there are four clocking elements 201–204, which are coupled together into a ring as is illustrated in FIG. 2. (These ring connections are omitted from FIG. 5 for clarity.) Clocking elements 201–204 provide clock signals to corresponding regions 501–504 of integrated circuit 200 as is illustrated in FIG. 5. Note that each clocking element 201–204 is coupled to a clock distribution network that routes the clock signal to various circuit elements within the respective regions 501–504.

Laying Out and Operating a Ring of Clocking Elements

Figure 6:
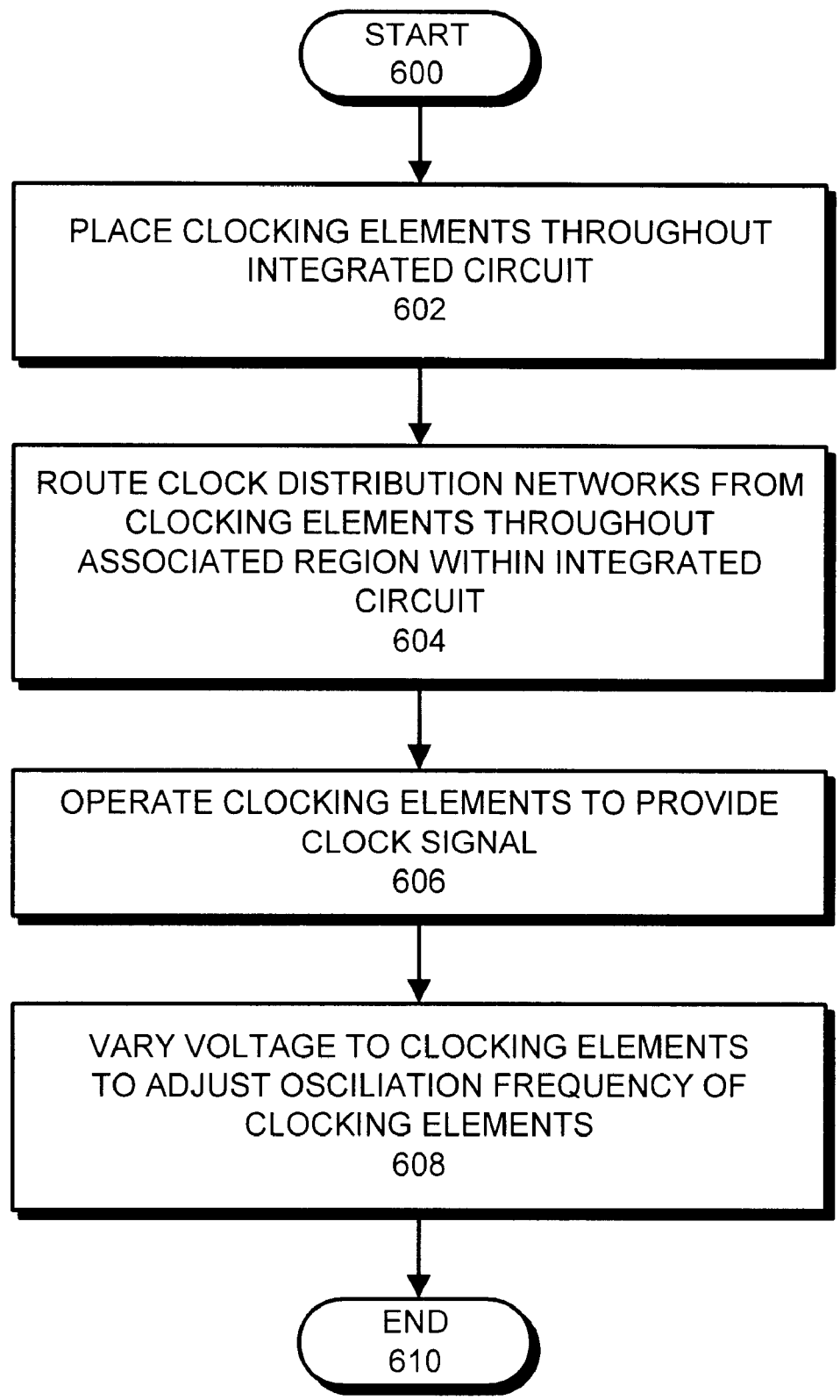
FIG. 6 is a flow chart illustrating the process of laying out and using a ring of clocking elements in accordance with an embodiment of the present invention.

FIG. 6 is a flow chart illustrating the process of laying out and operating a ring of clocking elements in accordance with an embodiment of the present invention. First, during a design phase of the circuit, clocking elements are placed at locations throughout the integrated circuit (step 602). Next, the system routes clock distribution networks from the clocking elements 201–204 to circuit elements in the associated regions 501–504 of integrated circuit 200 (step 604). After the circuit is fabricated, the clocking elements are operated from an initial state to provide a clock signal for the circuit elements within integrated circuit 200 (step 606). Finally, a supply voltage to clocking elements 201–204 can be varied in order to adjust the oscillation frequency of the ring of clocking elements (step 608).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that generates a clock signal within an integrated circuit, comprising:
   four clocking elements arranged in a ring, wherein each clocking element has at least one input and at least one output, wherein a signal at an input is complemented at a corresponding output;
   wherein the four clocking elements are spatially distributed throughout the integrated circuit so that each clocking element provides the clock signal to a different region of the integrated circuit; and
   a plurality of interconnections between the four clocking elements, wherein each output of each clocking element is coupled to at least one input of a neighboring clocking element;
   wherein a given signal is inverted an odd number of times in traversing a closed path beginning and ending at any output of any of the four clocking elements and passing through a neighboring clocking element.

2. The apparatus of claim 1, wherein each of the four clocking elements includes an even number of inverters and a keeper circuit.

3. The apparatus of claim 1, wherein each of the four clocking elements contains:
   a first node;
   a second node;
   a keeper circuit coupled between the first node and the second node;
   a first pair of inverters, each of which has an output coupled to the first node; and
   a second pair of inverters, each of which has an output coupled to the second node.

4. The apparatus of claim 3, wherein the keeper circuit includes a pair of cross-tied inverters coupled to the first node and the second node.

5. The apparatus of claim 3, wherein the first node and the second node of each of the four clocking elements comprise eight nodes that oscillate at the same frequency and are grouped into four synchronized pairs that are offset from each other in phase by 90 degrees, whereby the eight nodes provide a multi-phase clock signal.

6. The apparatus of claim 1, further comprising a controllable voltage source coupled to the four clocking elements, whereby varying a voltage provided by the controllable voltage source varies an oscillation frequency of the four clocking elements.

7. The apparatus of claim 1, further comprising a plurality of clock distribution networks within the integrated circuit, wherein each clock distribution network distributes the clock signal from a clocking element to circuit elements within an associated region of the integrated circuit.

8. The apparatus of claim 1, wherein an output of each clocking element is coupled to at least one input of each of two neighboring clocking elements.

9. The apparatus of claim 8, wherein the four clocking elements comprise a given ring within a higher-level ring of rings, wherein at least one input of a first clocking element in a given ring is coupled to an output of a second clocking element in a first neighboring ring, and wherein at least one output of a third clocking element in the given ring is coupled to an input of a fourth clocking element in a second neighboring ring.

10. An apparatus that generates a clock signal within an integrated circuit, comprising:
   four clocking elements arranged in a ring, wherein each clocking element has at least one input and at least one output, wherein a signal at an input is complemented at a corresponding output;
   wherein an output of each clocking element is coupled to at least one input of each of two neighboring clocking elements;
   wherein the four clocking elements are spatially distributed throughout the integrated circuit so that each clocking element provides the clock signal to a different region of the integrated circuit; and
   a plurality of interconnections between the four clocking elements, wherein each output of each clocking element is coupled to at least one input of a neighboring clocking element;
   wherein a given signal is inverted an odd number of times in traversing a closed path beginning and ending at any output of any of the four clocking elements and passing through a neighboring clocking element;

wherein each of the four clocking elements contains,
a first node,
a second node,
a keeper circuit coupled between the first node and the second node,
a first pair of inverters, each of which has an output coupled to the first node, and
a second pair of inverters, each of which has an output coupled to the second node.

11. The apparatus of claim 10, wherein the keeper circuit includes a pair of cross-tied inverters coupled to the first node and the second node.

12. The apparatus of claim 10, wherein the first node and the second node of each of the four clocking elements comprise eight nodes that oscillate at the same frequency and are grouped into four synchronized pairs that are offset from each other in phase by 90 degrees, whereby the eight nodes provide a multi-phase clock signal.

13. The apparatus of claim 10, further comprising a controllable voltage source coupled to the four clocking elements, whereby varying a voltage provided by the controllable voltage source varies an oscillation frequency of the four clocking elements.

14. The apparatus of claim 10, further comprising a plurality of clock distribution networks within the integrated circuit, wherein each clock distribution network distributes the clock signal from a clocking element to circuit elements within an associated region of the integrated circuit.

15. The apparatus of claim 10, wherein the four clocking elements comprise a given ring within a higher-level ring of rings, wherein at least one input of a first clocking element in a given ring is coupled to an output of a second clocking element in a first neighboring ring, and wherein at least one output of a third clocking element in the given ring is coupled to an input of a fourth clocking element in a second neighboring ring.

16. A method for generating a clock signal within an integrated circuit, the method operating through use of four clocking elements arranged in a ring, wherein each clocking element has at least one input and at least one output, wherein a signal at an input is complemented at a corresponding output, where the four clocking elements are coupled together through a plurality of interconnections, wherein each output of each clocking element is coupled to at least one input of a neighboring clocking element, wherein a given signal is inverted an odd number of times in traversing a closed path beginning and ending at any output of any clocking element and passing through a neighboring clocking element, the method comprising:
placing the four clocking elements throughout the integrated circuit so that each clocking element provides the clock signal to an associated region of the integrated circuit;
routing a plurality of clock distribution networks throughout the integrated circuit, so that each clock distribution network distributes the clock signal from a clocking element to circuit elements within the associated region; and
operating the four clocking elements so that the four clocking elements oscillate to provide the clock signal.

17. The method of claim 16, further comprising varying a voltage from a controllable voltage source coupled to the four clocking elements in order to vary an oscillation frequency of the four clocking elements.

18. The method of claim 16, wherein each of the four clocking elements includes an even number of inverters and a keeper circuit.

19. The method of claim 16, wherein each of the four clocking elements contains:

a first node;
a second node;
a keeper circuit coupled between the first node and the second node;
a first pair of inverters, each of which has an output coupled to the first node; and
a second pair of inverters, each of which has an output coupled to the second node.

20. The method of claim 19, wherein the keeper circuit includes a pair of cross-tied inverters coupled to the first node and the second node.

21. An apparatus that generates a clock signal through a closed loop clocking system within an integrated circuit, comprising:
a plurality of clocking elements;
a plurality of couplings between the plurality of clocking elements;
wherein each of the plurality of clocking elements is configured to oscillate at substantially the same frequency;
wherein the plurality of couplings creates a closed loop so that a disturbance at one clocking element or at one coupling causes other clocking elements in the plurality of clocking elements to compensate their oscillations, so that the plurality of clocking elements continue to oscillate at substantially the same frequency with substantially the same phase relationships between clocking elements.

22. The apparatus of claim 21, wherein each of the plurality of clocking elements includes an even number of inverters and a keeper circuit.

23. The apparatus of claim 21, wherein each of the plurality of clocking elements contains:
a first node;
a second node;
a keeper circuit coupled between the first node and the second node;
a first pair of inverters, each of which has an output coupled to the first node; and
a second pair of inverters, each of which has an output coupled to the second node.

24. The apparatus of claim 23, wherein the keeper circuit includes a pair of cross-tied inverters coupled to the first node and the second node.

25. The apparatus of claim 23, wherein there are four clocking elements, and wherein the first node and the second node of each of the plurality of clocking elements comprise eight nodes that oscillate at the same frequency and are grouped into four synchronized pairs that are offset from each other in phase by 90 degrees, whereby the eight nodes provide a multi-phase clock signal.

26. The apparatus of claim 21, further comprising a controllable voltage source coupled to the plurality of clocking elements, whereby varying a voltage provided by the controllable voltage source varies an oscillation frequency of the plurality of clocking elements.

27. The apparatus of claim 21, further comprising a plurality of clock distribution networks within the integrated circuit, wherein each clock distribution network distributes the clock signal from a clocking element to circuit elements within an associated region of the integrated circuit.

28. The apparatus of claim 21, wherein there are four clocking elements organized into a ring, and wherein an output of each clocking element is coupled to at least one input of each of two neighboring clocking elements.

* * * * *